United States Patent [19]
Rombach

[11] Patent Number: 5,852,383
[45] Date of Patent: Dec. 22, 1998

[54] CONTROL CIRCUIT FOR BICMOS BUS DRIVERS

[75] Inventor: Gerd Rombach, Freising, Germany

[73] Assignee: Texas Instruments Incorporated, Dallas, Tex.

[21] Appl. No.: 763,643

[22] Filed: Dec. 11, 1996

[30] Foreign Application Priority Data

Dec. 20, 1995 [DE] Germany .................. 195 47 754.5

[51] Int. Cl.$^6$ ........................................ G05F 1/10
[52] U.S. Cl. ........................... 327/538; 326/84; 326/86; 327/108; 327/109; 327/432
[58] Field of Search .................. 326/82, 83, 84, 326/86, 89, 90; 327/108, 109, 110, 111, 313, 319, 323, 333, 432, 530, 538, 539, 540

[56] References Cited

U.S. PATENT DOCUMENTS

| 4,322,634 | 3/1982 | Kaire et al. ........................ 327/538 |
| 4,600,876 | 7/1986 | Boeckman ........................... 323/311 |
| 5,187,386 | 2/1993 | Chang et al. ..................... 307/296.8 |
| 5,570,044 | 10/1996 | Martin et al. ......................... 326/86 |

FOREIGN PATENT DOCUMENTS

| 690 573 A1 | 1/1996 | European Pat. Off. . |
| 690 574 A1 | 1/1996 | European Pat. Off. . |

*Primary Examiner*—Timothy P. Callahan
*Assistant Examiner*—Jeffrey Zweizig
*Attorney, Agent, or Firm*—William B. Kempler; Richard L. Donaldson

[57] ABSTRACT

The invention relates to a "power on demand" control circuit and the application thereof in a BiCMOS bus driver. The basic object resides in the creation of such a circuit with a low power need and a simple structure. This aim is to be solved by the provision of a control loop comprising a diode series circuit arrangement (D1, D2) and a bipolar transistor (Q2) between the collector and the base of the output transistor (Q1), which is of such a size that in the stable L state the base current of the outlet transistor (Q1) is so selected that the L state is maintained.

6 Claims, 2 Drawing Sheets

CONTROL CIRCUIT FOR BICMOS BUS DRIVERS

The present invention relates to a control circuit and a BiCMOS bus driver employing such control circuit.

Integrated bus interface circuits are generally familiar in the prior art. They must be functionally in a position of making available and taking up large output currents. The order of magnitude of such currents is typically in a range of 50 to 100 mA.

These large currents are necessary in order to attain short signal propagation delay times and to instantaneously switch over the output (when driving a 75 ohm transmission line). The physical event determining such switching over operation is the discharge or, respectively, charging of the bus capacities present.

Once the output has reached a stable equilibrium state, i. e. the L state or, respectively, the H state, only a small fraction of the switched current or even no more current at all is necessary. The output load is then charged or, respectively, discharged and the transmission line resistance is then no longer detectable for the driver, after the signal has passed along the line (assuming an open ended transmission line).

In the case of modern computer systems the buses employed are in the stable, inactive L state or H state for 80% or even more of their operating time. Accordingly modern bus interface circuits are designed to take this into account. For this purpose they control their internal power consumption into account the requirements for driving the output load.

In connection with such circuits the slogan "power on demand" has become accepted. First developments in this field took place 1991.

For the present invention it is only the transition of the output from the H state to the L state which is significant as regards switching.

In known bus interface circuits after completing of switching in the equilibrium L state of the output a large amount of the base current of the output transistor is conducted away to ground by a clamping diode. Conventionally such clamping diode will be a Schottky diode intended to prevent the output transistor from being saturated.

It is clear that this fraction of the current, which is conducted off to ground is wasted power. This constitutes a problem, more particularly in battery driven systems with a strictly limited power supply.

One object of the present invention is accordingly to create a control circuit of this type, which is in a position of minimizing the power consumption of a BiCMOS bus driver after switching in the equilibrium L state and furthermore is easily produced, together with a BiCMOS bus driver employing such a control circuit.

In accordance with the invention a control circuit is contemplated for the control of the base current of a first bipolar transistor having a base, an emitter and a collector, said circuit comprising a second bipolar transistor which possesses a base, an emitter connected with the base of the first bipolar transistor, and a collector connected with a first supply potential; a first resistor connected between the first supply potential and the base of the second bipolar transistor; a diode means connected between the base of the second bipolar transistor and the collector of the first bipolar transistor; the diode means producing a voltage drop at the base of the second bipolar transistor, which amounts at least to the sum of the base-emitter voltages of the first and the second bipolar transistor; and the emitter of the first bipolar transistor being joined with a second supply potential.

Preferably the control circuit in accordance with the invention is characterized by a second resistor, which is connected between the emitter of the first bipolar transistor and the second supply potential.

As a further preferred feature the control circuit of the invention is characterized in that the diode means includes a series circuit arrangement of a pn junction diode and a Schottky diode.

Preferably the control circuit of the invention is characterized in that the pn junction diode is a base-collector short circuited npn transistor.

The invention also contemplates a BiCMOS bus driver with the control circuit in accordance with the invention which is characterized by a first NMOS transistor having a main current path connected between the emitter of the second bipolar transistor and the base of the first bipolar transistor and which possesses a gate for receiving an input signal; a second NMOS transistor having a main current path thereof connected between the base of the second bipolar transistor and the diode means and which possesses a gate for receiving the input signal; a third NMOS transistor having a main current path thereof extending between a node, which is placed between the first NMOS transistor and the base of the first bipolar transistor, and the second supply potential and which possesses a gate for receiving an inverted input signal; and a first PMOS transistor having a main current path thereof connected in parallelism to the first resistor and which possesses a gate for receiving the input signal.

As a preferred feature the BiCMOS bus driver of the invention is characterized by a fourth NMOS transistor having a main current path thereof connected in parallelism to the third NMOS transistor and which possesses a gate for receiving an impedance switching signal; and by a second PMOS transistor having a main current path thereof connected between the first supply potential and the collector of the second bipolar transistor and which possesses a gate for receiving a or the switching impedance signal.

A particularly advantageous feature of the novel control circuit is that the temperature dependent characteristics of the two arms compensate each other and that the clamping of the output transistor is dependent on the output current. Furthermore the circuit is suitable for use at high frequencies too.

In the following the present invention will be described in detail with reference to preferred embodiments, which are depicted in the accompanying drawings.

Figure 1:
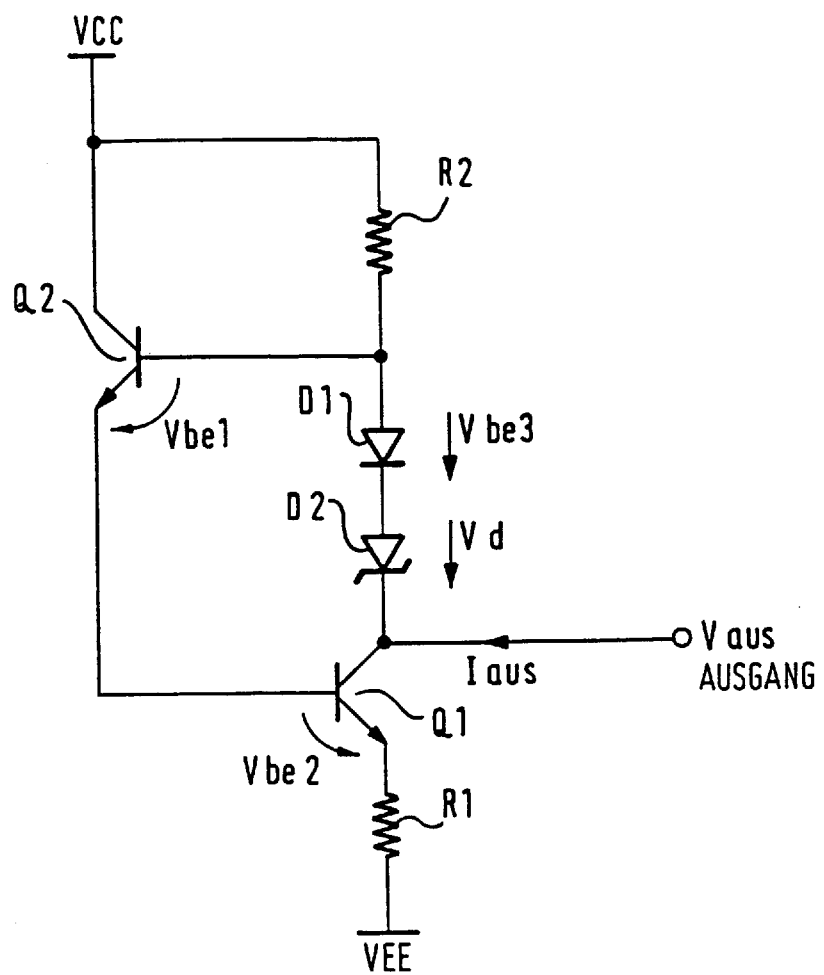
FIG. 1 shows an embodiment of the control circuit of the invention.

The control circuit in accordance with the invention is illustrated in FIG. 1. In such figure Q1 indicates a first bipolar transistor, and Q2 indicates a second bipolar transistor, whereof the emitter is joined with the base of the first bipolar transistor. The base-emitter voltages of the bipolar transistors Q1 and Q2 are denoted as Vbe1 and, respectively, Vbe2. The collector of the first bipolar transistor Q1 constitutes the output of the control circuit, that is to be connected with a load to be operated. Accordingly the first bipolar transistor Q1 is also termed the output transistor. Vaus and Iaus denote the output voltage and the output current of the output transistor Q1.

The collector of the second bipolar transistor Q2 is connected with a first supply potential VCC.

The emitter of the first bipolar transistor Q1 is connected with a second supply potential VEE. Preferably, a current limiting resistor R1 is placed between the emitter of the first bipolar transistor Q1 and the second supply potential VEE.

Between the collector of the first bipolar transistor Q1 and the base of the second bipolar transistor Q2 a series circuit arrangement comprising a pn junction diode D1 and a Schottky diode D2 is provided. The forward voltage of the pn junction diode D1 is termed Vbe3 and that of the Schottky diode is termed Vd.

Moreover the base of the second bipolar transistor Q2 is connected via a resistor R2 with the first supply potential VCC.

In what follows the operation of a control circuit designed on these lines will be explained.

Operation of this "power on demand" circuit is based on the principle that clamping of the output transistor Q1 is effected without the clamping diode between the base and the emitter of the same, which is provided in the prior art, only using the control loop between the base and the collector of the output transistor Q1.

This control loop comprises the diodes D1 and D2 and the second bipolar transistor Q2. The diode D1 is preferably an npn transistor with a short circuited base and collector, whose forward voltage Vbe1 amounts to approximately 0.75 V. The diode D2 is a Schottky diode, whose forward voltage Vd is typically 0.55 V.

Owing to the selected circuit design the voltage at the base of the second bipolar transistor Q2 will follow the output voltage at the collector of the output transistor Q1 with an offset of Vbe3+Vd due to the diode series circuit arrangement.

The following equation (1) defines the relationship between the output voltage Vaus and the voltages Vbe1, Vbe2, Vbe3 and Vd assuming that the current limiting resistor R1 is equal to zero:

$$V_{aus}=(V_{be1}+V_{be2})-(V_{be3}+V_d) \quad (1)$$

It will readily be seen that the sum Vbe3+Vd must be at least as large as the sum Vbe1+Vbe2 in order to turn on the output transistor Q1.

For a finite current limiting resistor R1 the equation (1) is modified to become the following one (2):

$$V_{aus}=(V_{be1}+V_{be2}+I_{aus} R1)-(V_{be3}+V_d) \quad (2)$$

In the event of the said output voltage Vaus falling below 0.2 V=2 ′ 0.75 V−0.75 V−0.55 V, the current will be limited to the current through the resistor R2 and to the base current of the bipolar transistor Q1, which is necessary to take up the output current Iaus (this base current being defined by: base current=output current (Iaus)/minor signal amplification (hfe)). In this respect the resistor R2 serves to set the base current of the bipolar transistor Q2.

A particular advantage of the control circuit of the invention will now be apparent, i. e. the output L state is temperature compensated. This is to be seen from the fact that the temperature dependence of a pn junction of 2 mV/°C. for the two transition voltages Vbe1+Vbe2 is opposite to that for the two transition voltages Vbe3=Vd and accordingly compensation takes place.

There is a further advantage of this "power on demand" circuit. The clamping of the output transistor Q1 is in fact dependent on the magnitude of the output current Iaus, as will be seen at a glance from the equation (2). The dependence factor in this respect is the voltage drop across the current limiting resistor R1, amounting to Iaus R1. Accordingly the output transistor is less clamped at the high output current Iaus than at a low output current.

Figure 2:
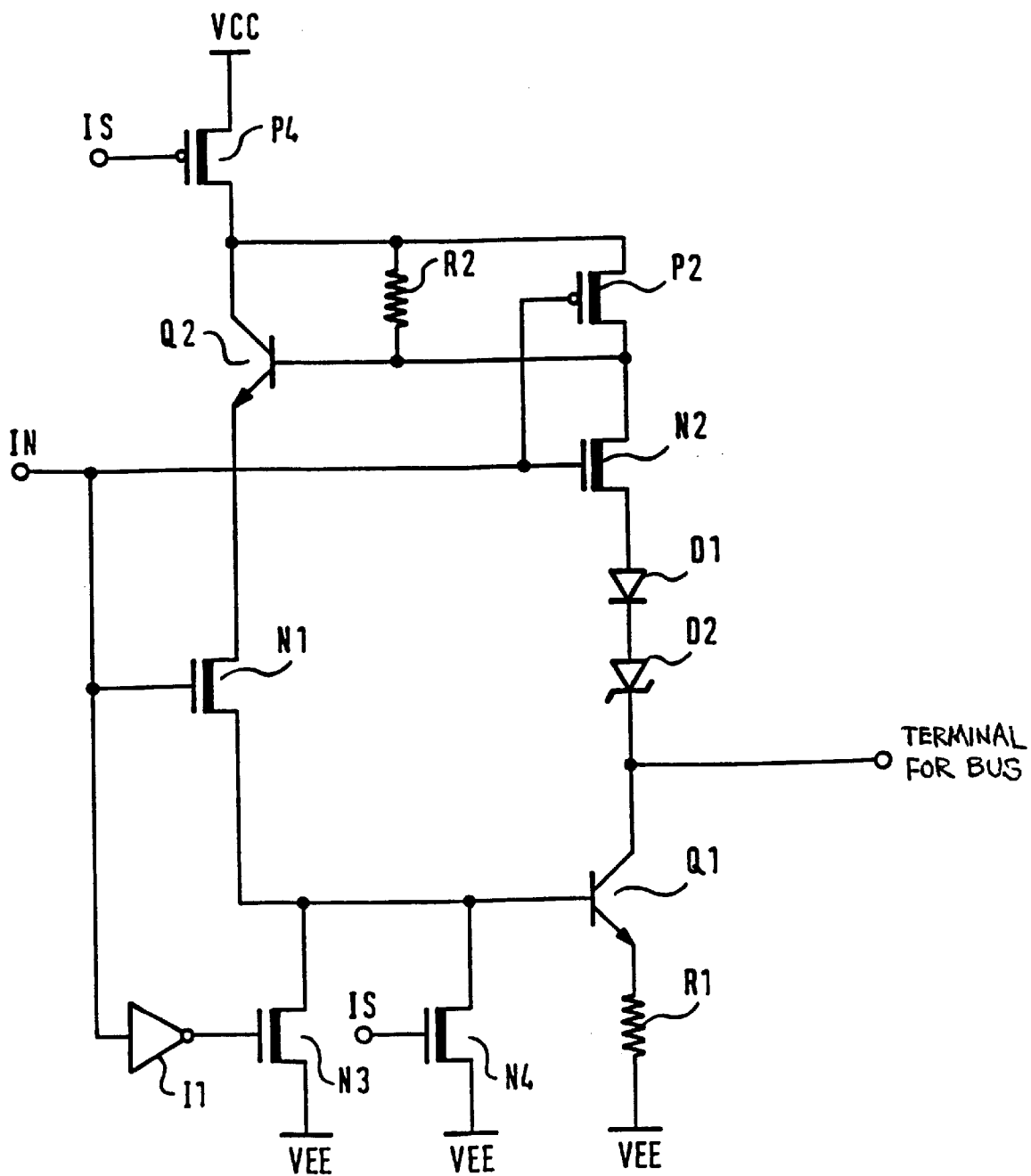
FIG. 2 shows a BiCMOS bus driver, which employs the control circuit in accordance with the invention.

In FIG. 2 a BiCMOS bus driver is illustrated, using the control circuit in accordance with the invention for the control of its internal power consumption.

In FIG. 2 components, which are the same as those of FIG. 1, are denoted by the same reference numerals and there is no repetition of the description thereof.

Reference N1 indicates a first NMOs transistor, which is connected so that its main current path is placed between the emitter of the second bipolar transistor Q2 and the base of the first bipolar transistor Q1 and which at its gate receives an input signal IN for switching the output transistor Q1 on and off.

There is furthermore a second NMOS transistor N2, whose main current path is connected between the base of the second bipolar transistor Q2 and the diode series circuit D1 and D2 and which receives the input signal IN at its gate too.

Furthermore there is a third NMOS transistor N3, whose main current path is placed between a node, which is between the first NMOS transistor N1 and the base of the first bipolar transistor Q1, and the second supply potential VEE. At its gate it receives an input signal inverted by an inverter I1.

Between the first supply potential VCC and the base of the second bipolar transistor Q2 there is the main current path of a first PMOS transistor P2, which receives the input signal IN at its gate.

At the H level of the input signal IN the MOS transistors N1 and N2 are accordingly turned on, whereas the transistors N3 and P2 are turned off.

On turning on the output transistor Q1 a high current will flow via the bipolar transistor Q2 and the MOS transistor N1 to the base of the bipolar transistor Q1. This switching current will be maintained until the output voltage is at the low level. At approximately 0.2 V the control circuit will be active and will limit the base current to the value, which is required for maintaining the output voltage, as already explained in connection with FIG. 1.

The two MOS transistors N2 and P2 serve for increasing the speed of the "power on demand" circuit. Since the resistor R1 should normally be large (for less power consumption in the equilibrium state of an L level or an H level at the output), the MOS transistor P2 will connect the base of the second bipolar transistor Q2 directly with the first supply potential VCC. In operation the base of the bipolar transistor Q2 will be placed at the first supply potential VCC, when the MOS transistors N1 and N3 turn off the output transistor Q1.

Additionally it is possible furthermore for further MOS transistors N4 and P4 to be provided in order to switch the output into the high ohmic state. N4 is an NMOS transistor, whose main current path is placed between the base of the first bipolar transistor Q1 and the second supply potential VEE and to whose gate an impedance switching signal IS may be applied. P4 is a PMOS transistor, whose main current path is connected between the first supply potential VCC and the collector of the second bipolar transistor and to whose gate the impedance signal IS may also be applied.

The control circuit in accordance with the invention may be employed for every bus driver, which is manufactured in BiCMOS technology. A significant feature of the invention is that the base voltage of the output transistor is controlled by the output voltage via the control loop when there is an L level at the output. The base current is in this respect so selected that the L level can be maintained at the output. It is more particularly not necessary to provide an excessively generous value of the base current from the output transistor Q1 in order to take account of all possible types of driver load.

The circuit of the invention accordingly possesses a low power consumption, even at a high frequency. This means that the circuit is particularly attractive for systems run on battery power.

I claim:

1. A control circuit for controlling the base current of a first bipolar transistor (Q1) having a base, an emitter and a collector, said circuit comprising:
    a) a second bipolar transistor (Q2) with a base, an emitter connected with the base of the first bipolar transistor (Q1), and a collector connected with a first supply potential (VCC);
    b) a first resistor (R2) which is connected between the first supply potential (VCC) and the base of the second bipolar transistor (Q2); and
    c) a diode means (D1, D2) which is connected between the base of the second bipolar transistor (Q2) and the collector of the first bipolar transistor (Q1);
    d) said diode means (D1, D2) producing a voltage drop at the base of the second bipolar transistor (Q2), which amounts to at least the base-emitter voltages (Vbe1, Vbe2) of the first and of the second bipolar transistor (Q1, Q2); and
    e) said emitter of the first bipolar transistor (Q1) being connected with a second supply potential (VEE).

2. The control circuit as claimed in claim 1, further comprising a second resistor (R1), which is connected between the emitter of the first bipolar transistor (Q1) and the second supply potential (VEE).

3. The control circuit as claimed in claim 1, wherein the diode means (D1, D2) comprises a series circuit arrangement composed of a pn junction diode (D1) and a Schottky diode (D2).

4. The control circuit as claimed in claim 3, wherein the said pn junction diode (D1) is a base-collector short circuited npn transistor.

5. A BiCMOS bus driver comprising:
    a control circuit for controlling the base current of a first bipolar transistor (Q1) having a base, an emitter and a collector, said circuit comprising:
        a) a second bipolar transistor (Q2) with a base, an emitter connected with the base of the first bipolar transistor (Q1), and a collector connected with a first supply potential (VCC);
        b) a first resistor (R2) which is connected between the first supply potential (VCC) and the base of the second bipolar transistor (Q2);
        c) a diode means (D1, D2) which is connected between the base of the second bipolar transistor (Q2) and the collector of the first bipolar transistor (Q1);
        d) said diode means (D1, D2) producing a voltage drop at the base of the second bipolar transistor (Q2), which amounts to at least the base-emitter voltages (Vbe1, Vbe2) of the first and of the second bipolar transistor (Q1, Q2);
        e) said emitter of the first bipolar transistor (Q1) being connected with a second supply potential (VEE);
        f) a first NMOS transistor (N1) having a main current path thereof connected between the emitter of the second bipolar transistor (Q2) and the base of the first bipolar transistor (Q1) and which possesses a gate for receiving an input signal (IN);
        g) a second NMOS transistor (N2) having a main current path thereof connected between the base of the second bipolar transistor (Q2) and the diode means (D1,D2), and which possesses a gate for receiving the input signal (IN);
        h) a third NMOS transistor (N3) having a main current path thereof extending between a node placed between the first NMOS transistor (N1) and the base of the first bipolar transistor (Q1) and the second supply potential (VEE), and which possesses a gate for receiving the inverted input signal; and
        i) a first PMOS transistor (P2) having a main current path thereof connected in parallelism to the first resistor (R2) and which possesses a gate for receiving the input signal (IN).

6. The BiCMOS bus driver as claimed in claim 5, comprising a fourth NMOS transistor (N4) having a main current path thereof connected in parallelism to the main current path of the third NMOS transistor (N3) and which possesses a gate for receiving an impedance switching signal (IS); and by a second PMOS transistor (P4) having a main current path thereof connected between the first supply potential (VCC) and the collector of the second bipolar transistor (Q2) and which possesses a gate for receiving a or, respectively, the impedance switching signal (IS).

* * * * *